(12) United States Patent
Shih et al.

(10) Patent No.: US 7,367,812 B2
(45) Date of Patent: May 6, 2008

(54) CIRCUIT BOARD AND ELECTRICAL ASSEMBLY USING THE SAME

(75) Inventors: An Shih, Miao-Li (TW); Cheng-Liang Hsiao, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 0 days.

(21) Appl. No.: 11/598,923

(22) Filed: Nov. 13, 2006

(65) Prior Publication Data
US 2007/0111556 A1    May 17, 2007

(30) Foreign Application Priority Data
Nov. 11, 2005    (TW)    ............... 94139746 A

(51) Int. Cl.
*H01R 12/00*    (2006.01)
*H05K 1/00*    (2006.01)

(52) U.S. Cl. ................. 439/65; 439/374; 439/951

(58) Field of Classification Search .................. 439/65, 439/374, 951, 79, 67
See application file for complete search history.

(56) References Cited

U.S. PATENT DOCUMENTS

| 5,044,980 A | * | 9/1991 | Krumme et al. ............ 439/496 |
| 6,957,975 B2 | | 10/2005 | Kuroda |
| 7,108,520 B1 | | 9/2006 | Delaney |

* cited by examiner

*Primary Examiner*—Javaid H. Nasri
(74) *Attorney, Agent, or Firm*—Wei Te Chung

(57) ABSTRACT

An exemplary circuit board (21) includes an indention portion at a side of the circuit board, and a plug slot (251). The indention portion includes a bottom wall (211) and a side wall (212), and the side wall located between the bottom wall and an end of the circuit board at the side of the circuit board. The plug slot is attached at the bottom wall and is adjacent the side wall. Spacing between the side wall and the plug slot at the bottom wall is less than spacing between the side wall and the plug slot at the end of the circuit board.

16 Claims, 6 Drawing Sheets

CIRCUIT BOARD AND ELECTRICAL ASSEMBLY USING THE SAME

FIELD OF THE INVENTION

The present invention relates to circuit boards, and more particularly to a circuit board having two side walls extending outward from an end thereof for facilitating safe electrical connection to another circuit board, and to an electrical assembly using such circuit board.

GENERAL BACKGROUND

A common electrical device such as a personal computer generally includes a plurality of electrical parts which are connected to each other by connectors. In many electrical assemblies used in such electrical devices, two circuit boards are connected to each other by an elongate electrical connector.

Part of a conventional electrical assembly 1 is illustrated in FIG. 5. The electrical assembly 1 includes a main circuit board 10, a connector 11, and a flexible printed circuit 12. The main circuit board 10 electrically is connected to the flexible printed circuit 12 by the connector 11.

Referring to FIG. 6, this shows the flexible printed circuit 12 disconnected from the main circuit board 10. The main circuit board 10 includes two sub-circuit boards (not labeled) welded together. An indention portion (not labeled) is formed at the center of an end of the main circuit board 10. The connector 11 includes a plug slot 111 and a plug body 112. The plug slot 111 is attached to the indention portion of the main circuit board 10. Each sub-circuit board of the main circuit board 10 includes two L-shaped parts 100 generally at two opposite sides of the indention portion respectively. Each L-shaped part 100 includes a bottom wall 102 and a side wall 103 perpendicular to each other.

The connector 11 includes the plug slot 111 and the plug body 112, with the plug body 112 being attached to the flexible printed circuit 12. The plug slot 111 has a plurality of indentations 115 formed at an interface thereof, and a plurality of electrical contacts fixed in the indentations 115 respectively. Two fixing boles 114 are defined in two opposite ends of the plug slot 111 respectively. Two symmetrically opposite wedges 113 are attached at two opposite ends of the plug body 112 respectively, corresponding to the fixing boles 114 of the plug slot 111. A plurality of pins 121 is arranged in a row on each of top and bottom sides of the plug body 112. The pins 121 are arranged to correspond to the indentations 115 of the plug slot 111. The main circuit board 10 includes a plurality of input and/or output circuits (not visible) formed at either or both sides of the sub-circuit boards thereof. The input and/or output circuits are electrically connected to the electrical contacts of the indentations 115 of the plug slot 111.

In assembly of the electrical assembly 1, firstly, the plug body 112 attached to the flexible printed circuit 12 is aligned with the plug slot 111 attached to the main circuit board 10. Secondly, the pins 121 of the plug body 112 are inserted into the indentations 115 of the plug slot 111. Simultaneously, the wedges 113 are pushed outward by the ends of the plug slot 111. Thirdly, once the pins 121 are fully received in the indentations 115, the wedges 113 resiliently snap into the fixing holes 114 respectively and fix the plug body 112 and the plug slot 111 together. In this position, the pins 121 are in electrical contact with the circuits of the main circuit board 10. Thus, the main circuit board 10 and the flexible printed circuit 12 are mechanically and electrically connected together.

There are a number of difficulties that may be experienced in the above-described assembly process. First, the distance spanned by the two wedges 113 is only slightly less than the distance between the two pairs of side walls 103 at opposite sides of the indention portion of the main circuit board 10. Therefore it can be difficult to bring the plug body 112 close to the plug slot 111 in alignment with the plug slot 111. Second, for similar reasons, the wedges 113 are liable to scrape the side walls 103 when the pins 121 of the plug body 112 are inserted into the indentations 115 of the plug slot 111. Third, the wedges 113 may not be fully or properly received in the fixing holes 114. When this happens, the electrical connection between any one or more of the pins 121 of the plug body 112 in the corresponding indentations 115 may be faulty or unreliable or even lost altogether.

Accordingly, what is needed is an electrical assembly configured to overcome the above-described problems.

SUMMARY

An exemplary circuit board includes an indention portion at a side of the circuit board, and a plug slot. The indention portion includes a bottom wall and a side wall, and the side wall located between the bottom wall and an end of the circuit board at the side of the circuit board. The plug slot is attached at the bottom wall and is adjacent the side wall. Spacing between the side wall and the plug slot at the bottom wall is less than spacing between the side wall and the plug slot at the end of the circuit board.

An exemplary electrical assembly includes a first circuit board, a second circuit board, a plug slot, and a plug body attached to the second circuit board. The first circuit board includes an indention portion at a side thereof. The indention portion includes a bottom wall and a side wall. The side wall is located between the bottom wall and an end of the circuit board at the side of the circuit board. The plug slot is attached at the bottom wall and adjacent the side wall. The plug body is configured to be connected to the plug slot. Spacing between the side wall of first circuit board and the plug slot at the bottom wall is less than spacing between the side wall and the plug slot at said end of the first circuit board.

A detailed description of embodiments of the present invention is given below with reference to the accompanying drawings.

BRIEF DESCRIPTION OF THE DRAWINGS

In the drawings, all the views are schematic.

DETAILED DESCRIPTION OF PREFERRED EMBODIMENTS

Figure 1:
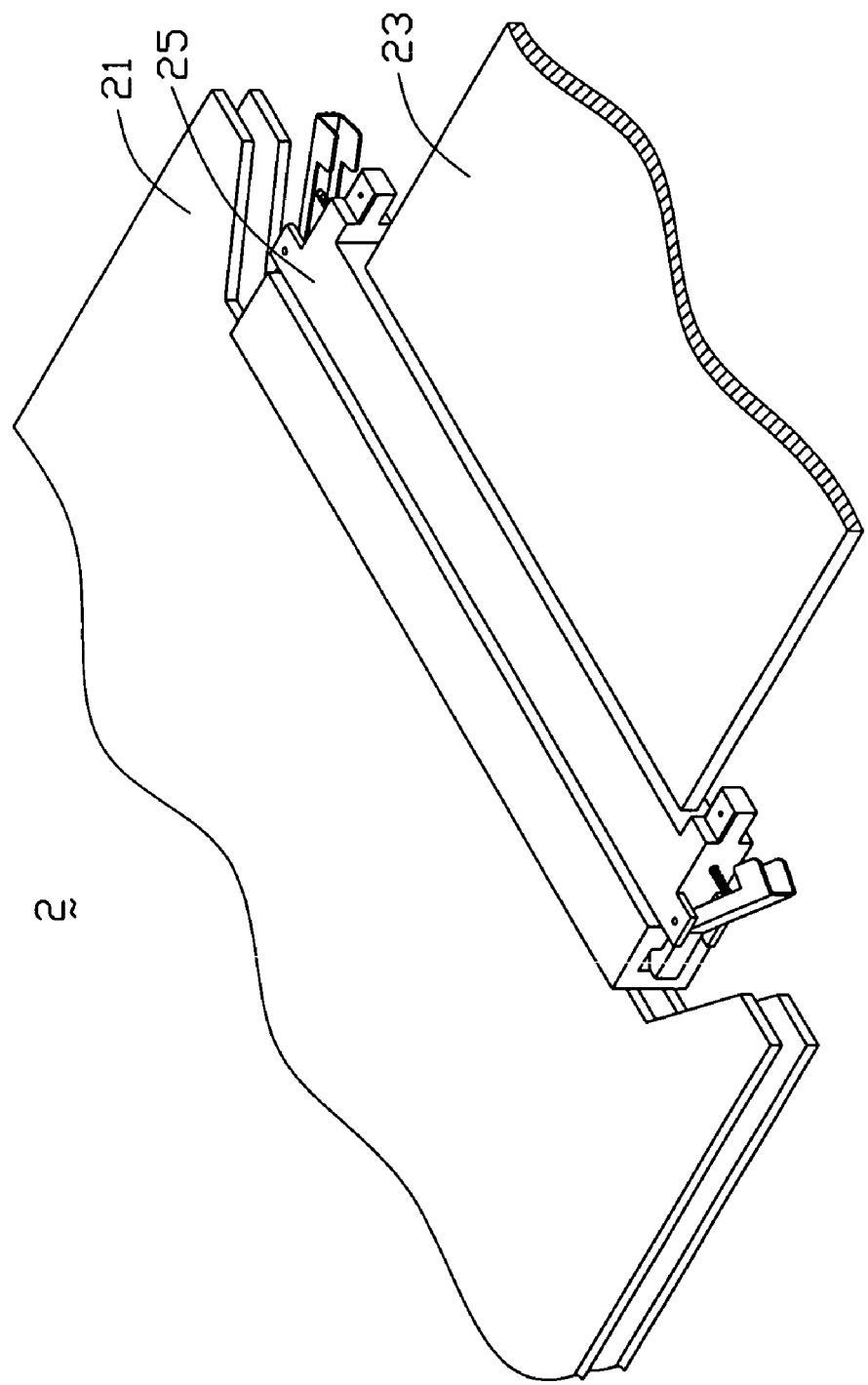
FIG. 1 is an isometric view of a part of an electrical assembly in accordance with a first embodiment of the present invention, the electrical assembly including a main circuit board and a flexible printed circuit connected to each other by a connector.

Referring to FIG. 1, this is an isometric view of an electrical assembly in accordance with a first embodiment of the present invention. The electrical assembly 2 includes a first circuit board 21, a second circuit board 23, and a connector 25. The first circuit board 21 is electrically connected to the second circuit board 23 by the connector 25.

Figure 2:
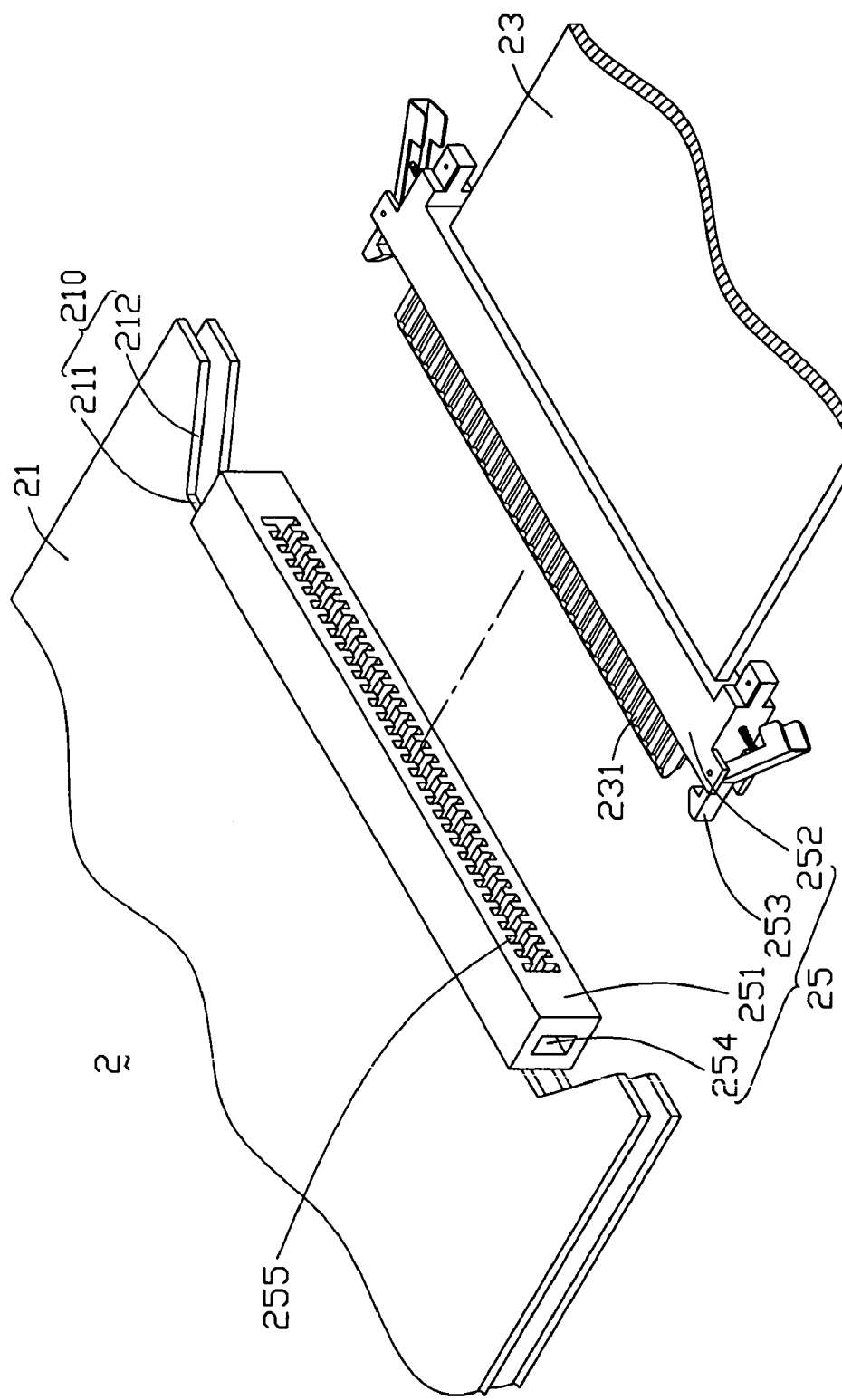
FIG. 2 is similar to FIG. 1, but showing the flexible printed circuit disconnected from the main circuit board.

Referring also to FIG. 2, this shows the second circuit board 23 disconnected from the first circuit board 21. The first circuit board 21 is formed by two sub-circuit boards (not labeled) welded together. The second circuit board 23 can, for example, be a flexible printed circuit. An indention portion (not labeled) is formed at a center portion of an end of the first circuit board 21. The connector 25 includes a plug slot 251 and a plug body 252. The plug slot 251 is attached to the indention portion of the first circuit board 21. Each sub-circuit circuit board of the first circuit board 21 includes two edge portions 210 generally at two opposite sides of the indention portion respectively. Each end portion 210 includes a bottom wall 211, and a side wall 212 extending obliquely from the bottom wall 211. An angle between the bottom wall 211 and the side wall 212 is larger than 90 degrees. Therefore, a distance between the side wall 212 and a corresponding end of the plug slot 251 progressively increases from the bottom wall 211 to a distal end edge of the end of the first circuit board 21.

The connector 25 includes the plug slot 251 and the plug body 112, with the plug body 252 being attached to the second circuit board 23. The plug slot 251 has a plurality of indentations 255 formed at an interface thereof, and a plurality of electrical contacts fixed in the indentations 255 respectively. Two fixing holes 254 are defined in two opposite ends of the plug slot 251 respectively. Two symmetrically opposite wedges 253 are attached at opposite ends of the plug body 252 respectively, corresponding to the fixing holes 254 of the plug slot 251. A plurality of pins 231 is arranged in a row on each of top and bottom sides of the plug body 252. The pins 231 are arranged to correspond to the indentations 255 of the plug slot 251. The first circuit board 21 includes a plurality of input and/or output circuits (not visible) formed at either or both sides of the sub-circuit boards thereof. The input and/or output circuits are electrically connected to the electrical contacts of the indentations 255 of the plug slot 251.

In assembly of the electrical assembly 2, firstly, the plug body 252 attached to the second circuit board 23 is aligned with the plug slot 251 attached to the first circuit board 21. Secondly, the pins 231 are inserted into the indentation 255 of the plug slot 251. Secondly, the pins 121 of the plug body 112 are inserted into the indentations 115 of the plug slot 111. Simultaneously, the wedges 253 are pushed outward by the ends of the plug slot 251. Thirdly, once the pins 231 are fully received in the indentations 255, the wedges 253 resiliently snap into the fixing holes 254 respectively and fix the plug body 252 and the plug slot 251 together. In this position, the pins 231 are in electrical contact with the circuits of the first circuit board 21. Thus, the first and second circuit boards 21, 23 are mechanically and electrically connected together. Because of the generally flared configuration of the indention portion of the first circuit board 21, it is relatively easy to align the plug body 112 with the plug slot 111, insert the pins 121 into the indentations 115, and fully and properly engage the wedges 253 in the fixing holes 254.

Figure 3:
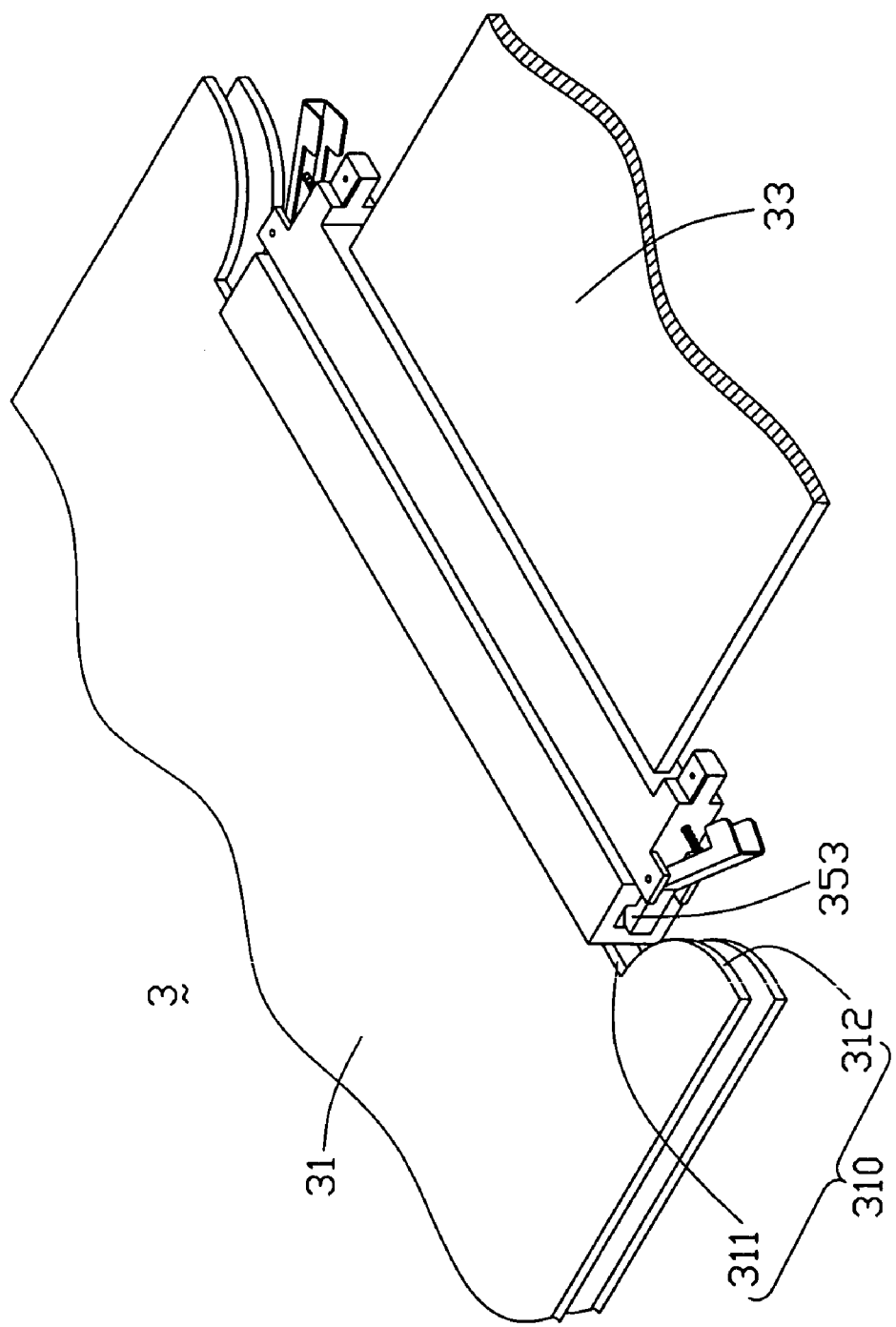
FIG. 3 is an isometric view of a part of an electrical assembly in accordance with a second embodiment of the present invention.

Referring to FIG. 3, this is an isometric view of an electrical assembly in accordance with a second embodiment of the present invention. The electrical assembly 3 of the second embodiment is similar to the above-described first embodiment. The electrical assembly 3 includes a first circuit board 31 and a second circuit board 33. The first circuit board 31 is formed by two sub-circuit boards (not labeled) welded together, and defines an indention portion. Each of opposite edge portions 310 of each sub-circuit board includes a bottom wall 311, and a convex side wall 312 extending outward from the bottom wall 311. In the illustrated embodiment, the side wall 312 is arc-shaped. A distance between the side wall 312 and a corresponding end of a plug slot (not labeled) progressively increases from the bottom wall 311 to a distal end corner of the first circuit board 31. Because of the curved flaring configuration of the indention portion of the first circuit board 31, the electrical assembly 3 achieves advantages similar to those described above in relation to first embodiment.

Figure 4:
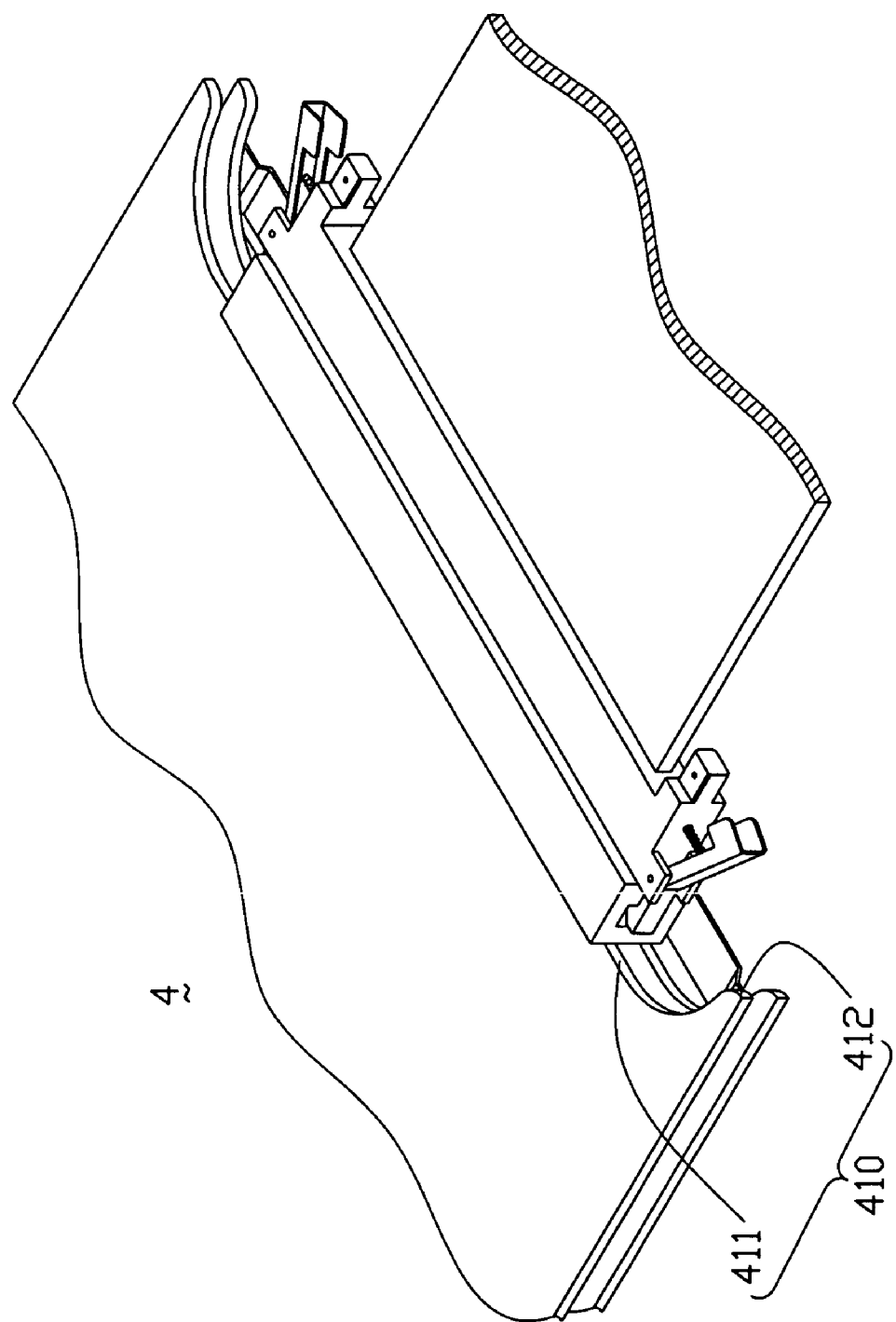
FIG. 4 is an isometric view of a part of an electrical assembly in accordance with a third embodiment of the present invention.
Figure 5:
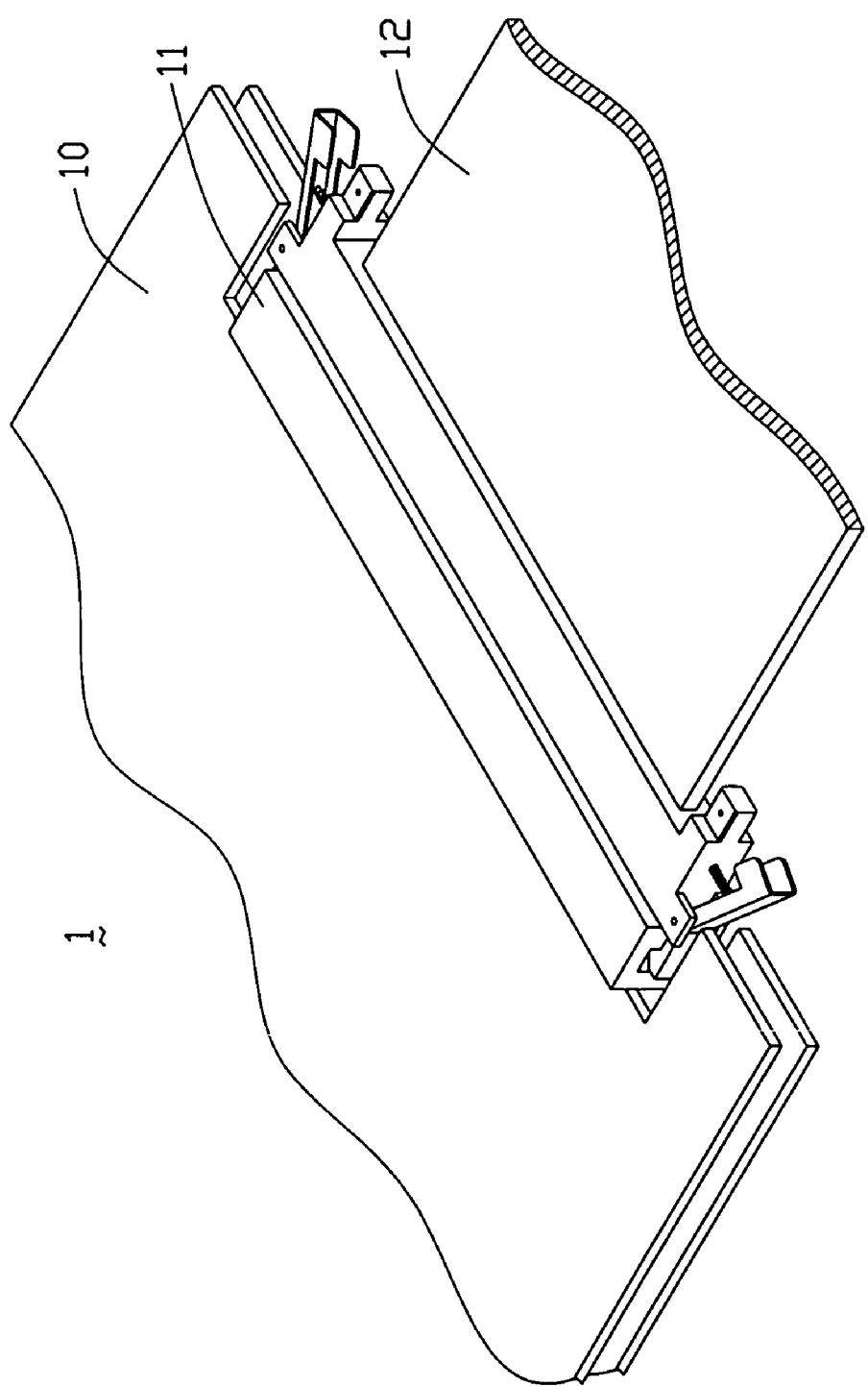
FIG. 5 is an isometric view of a part of a conventional electrical assembly, the electrical assembly including a main circuit board and a flexible printed circuit connected to each other by a connector.
Figure 6:
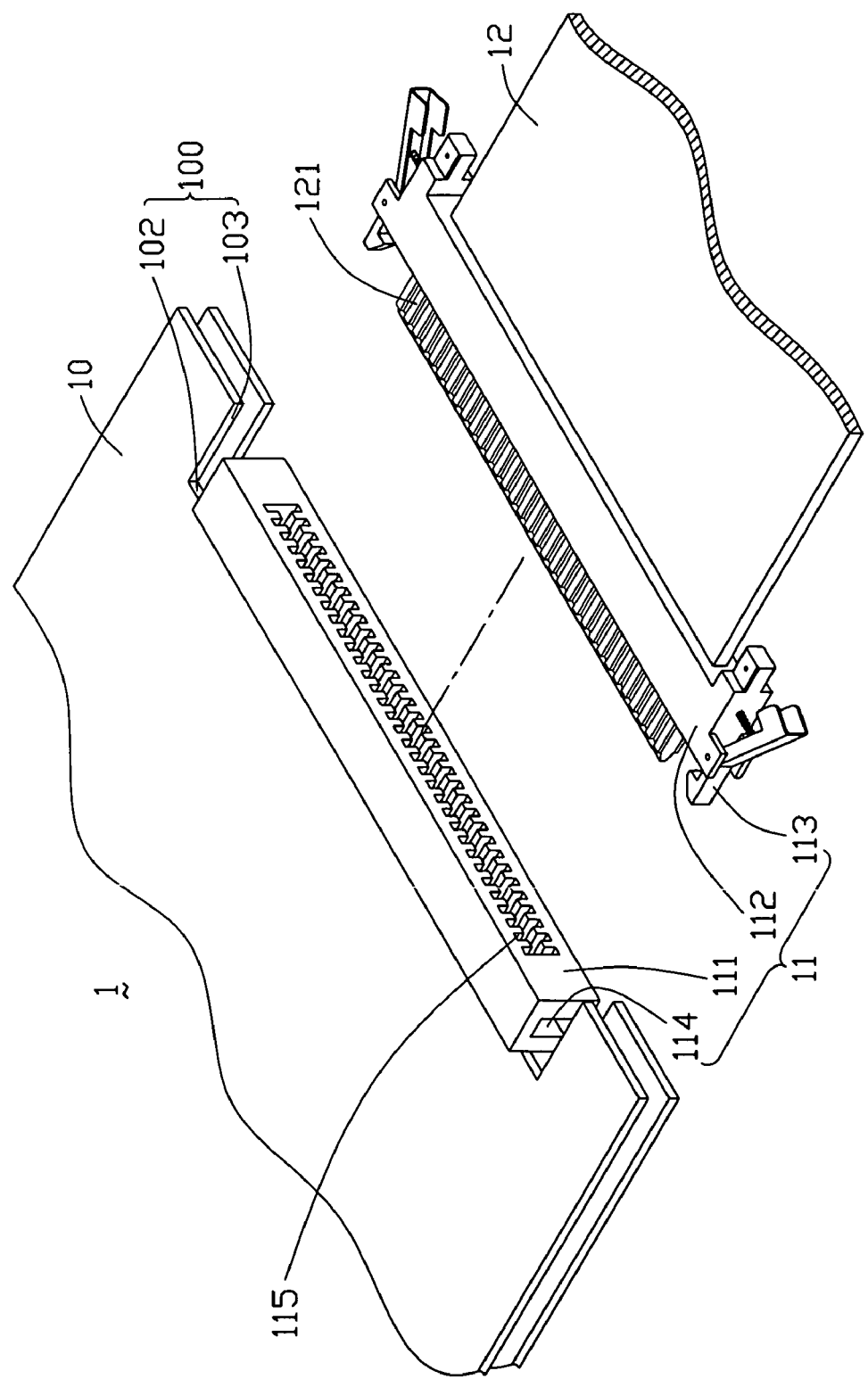
FIG. 6 is similar to FIG. 5, but showing the flexible printed circuit disconnected from the main circuit board.

Referring to FIG. 4 this is an isometric view of an electrical assembly in accordance with a third embodiment of the present invention. The electrical assembly 4 of the third embodiment is similar to the above-described second embodiment. The electrical assembly 4 includes a first circuit board (not labeled) and a second circuit board (not labeled). The first circuit board is formed by two sub-circuit boards (not labeled) welded together, and defines an indention portion. Each of opposite edge portions 410 of each sub-circuit board includes a bottom wall 411, and a concave side wall 412 extending outward from the bottom wall 411. In the illustrated embodiment, the side wall 412 is arc-shaped. A distance between the side wall 412 and a corresponding end of a plug slot (not labeled) progressively increases from the bottom wall 411 to a distal end corner of the first circuit board. Because of the curved generally flaring configuration of the indention portion of the first circuit board, the electrical assembly 4 achieves advantages similar to those described above in relation to first embodiment.

In alternative embodiments, the side walls 212, 312, 412 can have any other suitable shape or configuration whereby the spacing between the ends of the plug slot of the connector and the side walls 212, 312, 412 increases from the bottom wall 211, 311, 411 to the distal end of the first circuit board. The junction between the bottom wall 211, 311, 411 and the side wall 212, 312, 412 can be angular or a continuous curve. Only a single wedge and a single fixing hole 254 can be provided, according to need.

In summary, the above-described embodiments have at least the following advantages. The spacing between the side walls 212, 312, 412 and the corresponding wedges is generally flared. Therefore it is relatively easy to align the plug body 252 with the plug slot 251, insert the pins into the indentations, and fully and properly engage the wedges in the fixing holes 254. In addition, the risk of the wedges scraping the side walls 212, 312, 412 is minimized. Furthermore, in cases where the junction between the bottom wall 211, 311, 411 and the side wall 212, 312, 412 is a continuous curve, fabrication of the sub-circuit boards and/ or the first circuit board can be simplified. For example, a mold with a simple design can be used to fabricate the sub-circuit boards.

While the invention various preferred and exemplary embodiments have been described above, it is to be understood that the invention is not limited thereto. To the contrary, the above description is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A circuit board, comprising:
   an indention portion at a side of the circuit board, the indention portion comprising a bottom wall and a pair of side walls, each of the side walls located between a respective one of opposite ends of the bottom wall and an end of the circuit board at said side of the circuit board; and
   an elongate plug slot attached to the circuit board at the bottom wall and being between but spaced from the side walls;
   wherein a smallest spacing between each of opposite ends of the plug slot and the corresponding side wall at the bottom wall is nonzero and less than a spacing between each end of the plug slot and the corresponding side wall at said end of the circuit board.

2. The circuit board as claimed in claim 1, wherein the spacing between the side wall and the plug slot progressively increases from the bottom wall toward said end of the circuit board.

3. The circuit board as claimed in claim 1, wherein the side wail is rectilinear.

4. The circuit board as claimed in claim 1, wherein the side wall is curved.

5. The circuit board as claimed in claim 4, wherein the side wall is convex.

6. The circuit board as claimed in claim 5, wherein the side wall is arc-shaped.

7. The circuit board as claimed in claim 1, further comprising at least one circuit electrically connected to the plug slot.

8. An electrical assembly, comprising:
   a first circuit board comprising an indention portion at a side thereof, the indention portion comprising a bottom wall and a side wall, the side wall located between the bottom wall and an end of the circuit board at said side of the circuit board;
   a plug slot attached at the bottom wall of the first circuit board and being adjacent the side wall;
   a second circuit board; and
   a plug body attached to the second circuit board;
   wherein the plug body is configured to be connected to the plug slot, and a spacing between the side wall of the first circuit board and the plug slot at the bottom wall is less than a spacing between the side wall and the plug slot at said end of the first circuit board.

9. The electrical assembly as claimed in claim 8, wherein the side wall is rectilinear.

10. The electrical assembly as claimed in claim 8, wherein the side wall is curved.

11. The electrical assembly as claimed in claim 10, wherein the side wall is convex.

12. The electrical assembly as claimed in claim 8, wherein the first circuit board further comprises at least one circuit electrically connected to the plug slot.

13. The electrical Assembly as claimed in claim 8, wherein the plug slot comprises a fixing hole, the plug body comprises a wedge, and the wedge is configured to be engaged in the fixing hole such that the plug body is mechanically and electrically connected to the plug slot.

14. The electrical assembly as claimed in claim 8, wherein the second circuit board is a flexible printed circuit.

15. A printed circuit board assembly comprising:
   a printed circuit board;
   an indention portion inwardly recessed from one edge of the printed circuit board, said indention portion comprising a bottom section, and two opposite side sections connected between the edge and the bottom section; and
   an elongated plug slot connector assembled to the printed circuit board with a rear face of the plug slot connector essentially adjacent to the bottom section; wherein
   the side sections essentially extend in a diverging manner from the bottom section toward the edge, and leave sufficient space from corresponding opposite ends of the plug slot connector.

16. The printed circuit board assembly as claimed in claim 15, wherein the space is generally compliant with a configuration of a wedge which is positioned on a plug body connector attached to another printed circuit board coupled to said printed circuit board via said plug slot connector and said plug body connector.

* * * * *